(12) United States Patent
Oka

(10) Patent No.: US 10,038,126 B2
(45) Date of Patent: Jul. 31, 2018

(54) LIGHT-EMITTING DEVICE AND POWER SUPPLY CONNECTOR FOR LIGHT-EMITTING DEVICE

(71) Applicant: NICHIA CORPORATION, Anan-shi, Tokushima (JP)

(72) Inventor: Yuta Oka, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/385,581

(22) Filed: Dec. 20, 2016

(65) Prior Publication Data

US 2017/0179355 A1      Jun. 22, 2017

(30) Foreign Application Priority Data

Dec. 21, 2015 (JP) .................. 2015-248546

(51) Int. Cl.
*H01L 33/62* (2010.01)
*H01L 33/48* (2010.01)
*H01R 24/66* (2011.01)
*H01R 103/00* (2006.01)

(52) U.S. Cl.
CPC ............ *H01L 33/62* (2013.01); *H01L 33/486* (2013.01); *H01R 24/66* (2013.01); *H01L 2224/48091* (2013.01); *H01L 2224/48137* (2013.01); *H01R 2103/00* (2013.01)

(58) Field of Classification Search
CPC ....... H01L 33/62; H01L 33/486; H01L 24/66; H01L 2224/48137
See application file for complete search history.

(56) References Cited

U.S. PATENT DOCUMENTS

| 8,502,252 B2* | 8/2013 | Groetsch ............... H01L 33/486 257/100 |
| 8,624,491 B2* | 1/2014 | Sakumoto ............. H01L 33/505 257/100 |
| 9,512,970 B2* | 12/2016 | Edwards .................. F21V 9/16 |
| 2005/0239227 A1 | 10/2005 | Aanegola et al. |
| 2007/0102722 A1 | 5/2007 | Ishizaka et al. |
| 2010/0270580 A1 | 10/2010 | Posselt |
| 2013/0250562 A1 | 9/2013 | Tanaka et al. |
| 2013/0328088 A1 | 12/2013 | Morikawa |
| 2014/0055022 A1 | 2/2014 | Kimiya et al. |
| 2014/0091333 A1 | 4/2014 | Tamura et al. |
| 2015/0308632 A1 | 10/2015 | Ueno et al. |

(Continued)

FOREIGN PATENT DOCUMENTS

| CN | 102738137 B | 2/2015 |
| DE | 10 2013 200 900 A1 | 7/2014 |
| EP | 2 937 628 A1 | 10/2015 |

(Continued)

*Primary Examiner* — Dung Le
(74) *Attorney, Agent, or Firm* — Foley & Lardner LLP

(57) ABSTRACT

A light-emitting device includes a support having a primary surface; a power supply connector located on the primary surface of the support and including one or more wire pads; a light-emitting element located on the primary surface of the support; one or more wires connecting the light-emitting element and the wire pads; and a cover member located on the primary surface of the support and covering the light-emitting element and the wire pads.

10 Claims, 10 Drawing Sheets

(56) References Cited

U.S. PATENT DOCUMENTS

2015/0338069 A1  11/2015  Tamura et al.

FOREIGN PATENT DOCUMENTS

| | | |
|---|---|---|
| JP | 2007-535175 A | 11/2007 |
| JP | 2009-032650 A | 2/2009 |
| JP | 2013-131732 A | 7/2013 |
| JP | 2013-201256 A | 10/2013 |
| JP | 2013-258180 A | 12/2013 |
| JP | 2014-041794 A | 3/2014 |
| JP | 2014-071991 A | 4/2014 |
| JP | 2014-071992 A | 4/2014 |
| JP | 2014-072353 A | 4/2014 |
| JP | 2014-093170 A | 5/2014 |
| JP | 2014-107411 A | 6/2014 |
| JP | 2014-192252 A | 10/2014 |
| JP | 2015-070158 A | 4/2015 |
| WO | WO-2014/050655 A1 | 4/2014 |
| WO | WO-2014/110396 A1 | 7/2014 |

\* cited by examiner

LIGHT-EMITTING DEVICE AND POWER SUPPLY CONNECTOR FOR LIGHT-EMITTING DEVICE

CROSS-REFERENCE TO RELATED APPLICATION

This application claims priority to Japanese Patent Application No. 2015-248546, filed on Dec. 21, 2015, the disclosure of which is hereby incorporated by reference in its entirety.

BACKGROUND

The present disclosure relates to a light-emitting device and a power supply connector for a light-emitting device.

In recent years, in the field of lighting devices, semiconductor light-emitting elements have been used, replacing incandescent lamps and fluorescent lamps. A typical example of a semiconductor light-emitting element is a light emitting diode (i.e., LED). Using semiconductor light-emitting elements, it is possible to realize lighting devices that last longer and consume less power as compared with incandescent lamps and fluorescent lamps.

Typically, semiconductor light-emitting elements emit light by receiving DC power supply. In contrast, conventional incandescent lamps and fluorescent lamps emit light by receiving AC power. Therefore, a lighting device using a semiconductor light-emitting element is typically configured to include: a light-emitting device having a light-emitting element mounted therein and having a connector; and a power supply including a power supply circuit for converting AC power into DC power and a terminal or a connector that can be connected to the connector of the light-emitting device. For example, Japanese Laid-Open Patent Publication No. 2013-201256 discloses a light-emitting module including a heat spreader, a connector provided on the heat spreader, and a wiring board having an LED element mounted thereon.

SUMMARY

In view of lowering the energy consumption, it is important that low-power-consumption lighting devices that are capable of replacing incandescent lamps and fluorescent lamps become prevalent. For this, there is a demand for realizing a light-emitting device made up of fewer parts and having a lower manufacturing cost.

An example embodiment of the present application provides a light-emitting device that is made up of fewer parts and of which the manufacturing cost can be reduced.

A light-emitting device of the present disclosure includes: a support having a primary surface; a power supply connector located on the primary surface of the support and including one or more wire pads; a light-emitting element located on the primary surface of the support; and one or more wires connecting the light-emitting element and the one or more wire pads; and a cover member located on the primary surface of the support and covering the light-emitting element and the wire pads.

Certain embodiments of the present application provide a light-emitting device that is made up of fewer parts and of which the manufacturing cost can be reduced.

DETAILED DESCRIPTION DESCRIPTION OF EMBODIMENTS

Example embodiments of a light-emitting device will now be described in detail. The following embodiments are illustrative, and the present invention is not limited to the embodiments. In the following description of the embodiments, where reference signs are used in the figures, similar descriptions may be omitted or elements not referred to in the description may not be assigned reference signs for ease of understanding or for avoiding unnecessary redundancy.

First Embodiment

Figure 1A:
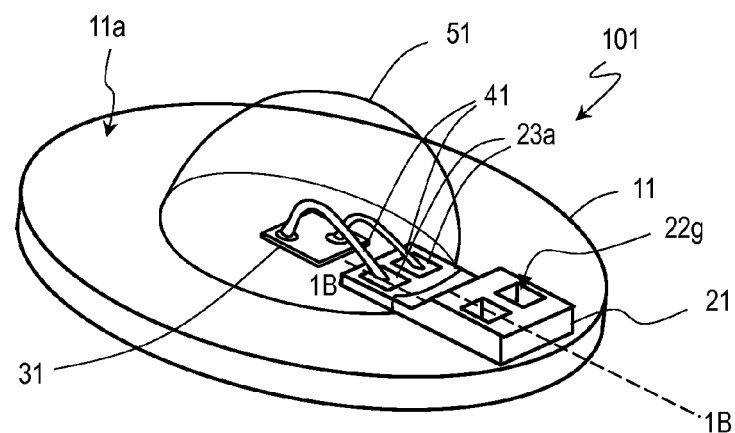
FIG. 1A is a perspective view showing an example of a light-emitting device of a first embodiment.

FIG. 1A is a perspective view showing an example of a light-emitting device 101 of the present embodiment. The light-emitting device 101 includes a support 11, a power supply connector 21, a light-emitting element 31 and wires 41. The light-emitting device 101 preferably further includes a cover member 51 located on the support 11, covering the light-emitting element 31. In FIG. 1A and the subsequent figures, only the outer shape of the cover member 51 is shown, and the inside structure covered by the cover member 51 is shown, for ease of understanding.

[Support 11]

The support 11 has a primary surface 11a, and supports thereon the power supply connector 21 and the light-emitting element 31. The support 11 preferably has a high thermal conductivity so that heat generated from the light-emitting element 31 is efficiently conducted and dissipated. The support 11 may or may not be insulative. A non-insulative, i.e., conductive, support 11 may be a plate-shaped member of a metal such as aluminum, copper, titanium or stainless steel. An insulative support 11 may be a plate-shaped member formed from an insulative material such as aluminum nitride, silicon nitride, aluminum oxide (alumina)

or silicon oxide, for example. The support 11 may also be a plate-shaped member formed of a resin such as a phenolic resin, an epoxy resin, a polyimide resin, a BT resin, polyphthalamide (PPA) or polyethylene terephthalate (PET). When a resin-made plate-shaped member is used, a ceramic or metal mounting board may further be provided, which has a better thermal conductivity than a resin.

The support 11 may be a plate-shaped member including primary surfaces, one or both of which may be conductive and have one or more insulating layers located thereon. In other words, a layer of an insulator or a resin described above may be provided on one primary surface or on each of primary surfaces of the conductive plate-shaped member described above. More specifically, for example, an aluminum layer is formed by sputtering on the surface of a conductive plate-shaped member and oxidized in the atmospheric air to provide a transparent alumina layer, or an inorganic material (specifically, aluminum oxide, silicon oxide, aluminum nitride or silicon nitride) may be formed by sputtering, an atomic layer deposition method (ALD), or the like. When the primary surface 11a of the support 11 is insulative, it is possible, for example, to improve the insulation between the wires 41 and the support 11, increasing the reliability of the light-emitting device 101.

In order to increase the emission efficiency for light to be emitted from the light-emitting device 101, the primary surface 11a of the support 11 may be highly reflective. For example, a metal layer having a high reflectance may be formed on the primary surface 11a of the support 11. Alternatively, a layer or a member having a high reflectance may be provided only in a portion of the primary surface 11a of the support 11 where the light-emitting element 31 is mounted. For example, the support 11 may be a plate-shaped member formed of aluminum, and a plate-shaped member of aluminum having high-reflectance may be provided, by means of welding, or the like, in a region where the light-emitting element 31 is mounted.

The thickness of the support 11 is about 0.1 mm or more and about 10 mm or less, for example. It suffices for the support 11 to have a sufficient mechanical strength to function as a support, depending on the material used in the support 11, i.e., a strength less likely to be deformed during the manufacture of the light-emitting device 101 or during the manufacture of a lighting device or other applications using the light-emitting device 101.

The support 11 may have any size depending on its application. For example, when the outer shape needs to be similar to those of ordinary household light bulbs, the support 11 has a circular shape having a diameter of about 1 cm or more and about 10 cm or less, or a rectangular shape of a similar size, for example.

In view of the ease of processing of the support 11 and the cost of the support 11 as a component, it is preferred to employ the support 11 formed of a plate-shaped metal member with an electrically insulating layer provided on the surface thereof

[Power Supply Connector 21]

Figure 1B:
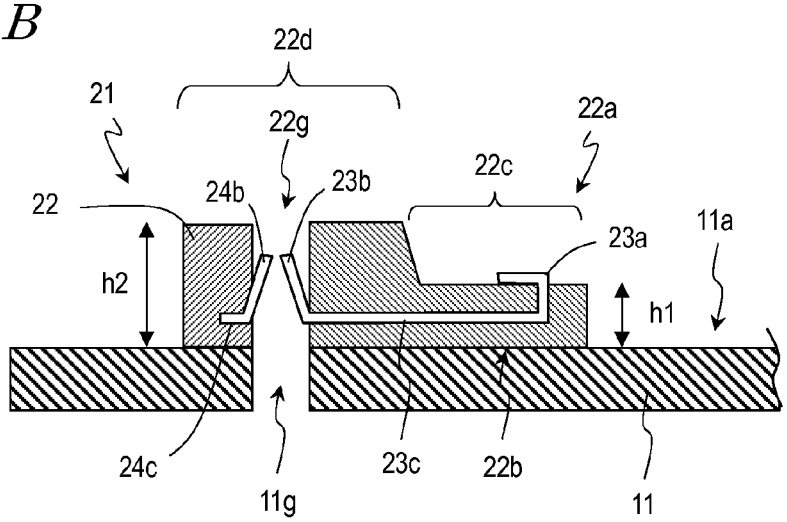
FIG. 1B is a cross-sectional view taken along line 1B-1B of FIG. 1A.

FIG. 1B is a schematic view showing a cross section of the power supply connector 21 supported on the support 11. The power supply connector 21 includes a body 22, wire pads 23a, and external terminals 23b and 24b. The power supply connector 21 is capable of engaging with pins or connectors through which power is supplied, and functions as an interconnect for transmitting power supplied from outside to the wire pads 23a.

The body 22 has an upper surface 22a and a lower surface 22b, and the lower surface 22b is secured on the support 11. For example, the body 22 is connected to the support 11 by placing an adhesive between the lower surface 22b and the primary surface 11a of the support 11.

In the present embodiment, the body 22 has a first portion 22c and a second portion 22d. The first portion 22c includes the wire pads 23a, and the second portion 22d includes a portion to be engaged with external pins or connectors through which power is supplied. Specifically, a set of wire pads 23a are provided on the upper surface 22a in the first portion 22c. Holes 22g are provided in the second portion 22d. In the present embodiment, two holes 22g are provided. The external terminals 23b and 24b are located inside each of the holes 22g.

The external terminals 23b in the holes 22g are electrically connected to the wire pads 23a via a connecting portion 23c buried inside the body 22. Similarly, the external terminals 24b is connected to a buried portion 24c buried inside the body 22. The wire pads 23a, the connecting portion 23c and the external terminals 23b may be an integrally-formed metal member, and the external terminals 24b and the buried portion 24c may be an integrally-formed metal member. Alternatively, the wire pads 23a and the external terminals 23b may be members independent of each other, which are electrically connected to each other by the conductive connecting portion 23c.

As shown in FIG. 1B, the support 11 has holes 11g located so as to correspond to each holes 22g provided in the body 22 of the power supply connector 21. The sizes of the holes 22g of the power supply connector 21 may be equal to or different from the sizes of the holes 11g of the support 11. The holes 22g of the power supply connector 21 may be larger or smaller than the holes 11g of the support 11 as long as a set of pins, through which power is supplied from outside, are in contact at least with the external terminals 23b in the holes 22g of the power supply connector 21.

In order for the external terminals 23b to contact the pins with a low resistance, the contact areas between the pins and the external terminals 23b are preferably large. It is therefore preferred that the external terminals 23b have certain lengths in the direction in which the holes 22g extends and that the height h2 of the second portion 22d of the body 22 is large. On the other hand, wire pads 23a, which are located on the first portion 21c of the power supply connector 21, are connected to ends of the wires 41. The wires 41 include rising portions which rise from the surfaces of the wire pads 23a and it is preferable that the rising portions of the wires 41 do not shade the light emitted from the light-emitting element. Therefore, it is preferable that the wire pads 23a are positioned at lower heights from the primary surface 11a of the support 11 and that the height h1 of the first portion 22c of the power supply connector 21 is lower. For example, it is preferred that the relationship h1<h2 is satisfied.

[Light-Emitting Element 31]

The light-emitting element 31 is preferably a semiconductor light-emitting element. It may be a known light-emitting element made from any of various semiconductor materials, such as a light-emitting diode (LED) or a laser diode (LD). A wavelength range of light emitted from the light-emitting element 31 may be appropriately selected. For example, in order to emit blue or green light, the light-emitting element 31 may include a semiconductor layer formed from a nitride-based semiconductor ($In_xAl_yGa_{1-x-y}N$, $0 \le X$, $0 \le Y$, $X+Y \le 1$). In order to emit red light, it may include a semiconductor layer formed from GaAlAs or AlInGaP. A light-emitting element formed from any other semiconductor material may also be used. For the semiconductor used for the light-emitting element, a composition, a color of light emission, a size and the number thereof may be appropriately selected depending on the purpose. Various light-emitting wavelengths may be selected depending on the material of the semiconductor layer and the degree of crystal mix thereof. The wavelength range of light emitted from the light-emitting element 31 is not limited to visible light, but may also be ultraviolet light and infrared light.

Figure 1C:
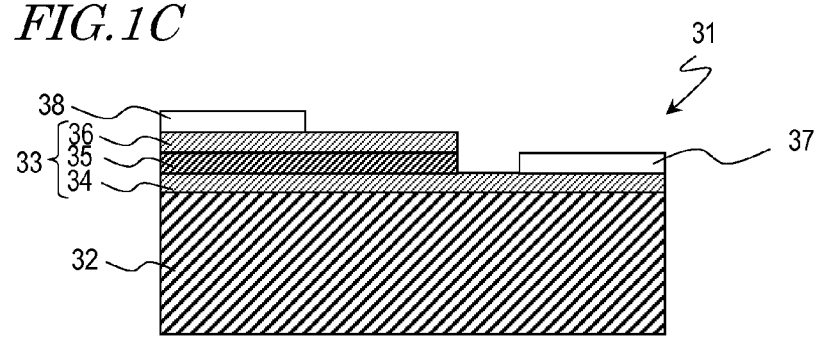
FIG. 1C is a schematic cross-sectional view of a light-emitting element.

FIG. 1C is a schematic cross-sectional view showing an example of the light-emitting element 31. The light-emitting element 31 includes a substrate 32 and a semiconductor layered structure 33 formed on the substrate 32. The semiconductor layered structure 33 includes an active layer 35, and an n-side semiconductor layer 34 and a p-side semiconductor layer 36 with the active layer 35 disposed therebetween. The light-emitting element 31 further includes an n electrode 37 and a p electrode 38 electrically connected to the n-side semiconductor layer 34 and the p-side semiconductor layer 36, respectively.

Other than the semiconductor layer described above, the semiconductor layer structure 33 may include various other semiconductor layers, such as a buffer layer for improving the crystalline quality of the semiconductor layer to be layered thereon, a semiconductor layer for improving the efficiency of injecting electrons or holes into the active layer, and a semiconductor layer for reducing the contact resistance with the n electrode 37 or the p electrode 38.

In the present embodiment, the light-emitting element 31 has a face-up structure, and emits light from the side on which the n electrode 37 and the p electrode 38 are provided. In order to increase the emission efficiency, a reflective layer may be included between the active layer 35 and the substrate 32 or on the back surface of the substrate 32.

The light-emitting element 31 may be resin-encapsulated or may be a bare chip. The light-emitting element 31 is preferably a bare chip in order to reduce the manufacturing cost. Herein, "bare chip" means the chip is not packaged. A protective film, such as an oxide film or a nitride film, may be formed on the surface of the chip. The light-emitting element 31 is located on the support 11 so that the back surface of the substrate 32 is in contact with the primary surface 11a of the support 11.

[Wires 41]

The wires 41 electrically connect then electrode 37 and the p electrode 38 of the light-emitting element 31 with the two wire pads 23a of the power supply connector 21. Specifically, one end of each wire 41 is electrically connected to then electrode 37 or the p electrode 38, with the other end thereof connected to one of the two wire pads 23a. The wires 41 are made from a wire material of gold, silver, copper, platinum, aluminum, etc., or an alloy thereof, and are connected by using any wire bonding technique commonly used in the field of semiconductor manufacturing technology.

[Cover Member 51]

The cover member 51 is located on the support 11 and covers the light-emitting element 31. The cover member 51 covers the light-emitting element 31, thereby protecting the light-emitting element 31 from the ambient environment. More preferably, the cover member 51 covers the wires 41 and the wire pads 23a. That is, the cover member 51 may cover a portion of the power supply connector 21 where the wire pads 23a are located, and expose the other portion of the power supply connector 21. This makes it possible to also protect the wires 41 and the wire pads 23a from the ambient environment and increases the reliability of the light-emitting device 101. The cover member 51 can also control the light distribution characteristics of light emitted from the light-emitting element 31. Also since the the external terminals 23b and 24b are not covered with the cover member 51, the power supply connector 21 can secure electrically connection to an outer circuit.

The material of the cover member 51 may be a thermosetting resin such as a silicone resin, a silicone-modified resin, an epoxy resin and a phenolic resin, a thermoplastic resin such as a polycarbonate resin, an acrylic resin, a methylpentene resin and a polynorbornene resin, or a translucent material such as a glass. A silicone resin is preferably selected, among materials above, in view of its light resistance and ease of shaping. The cover member 51 may contain a wavelength conversion material such as a phosphor, a colorant, etc., for absorbing light emitted from the light-emitting element 31 to emit light of a different wavelength. In order to increase the uniformity of light emitted from the light-emitting element 31, the cover member 51 may further contain a light-diffusing material.

As described above, the wavelength conversion material may be selected from materials capable of absorbing light emitted from the light-emitting element 31 and converting the wavelength thereof into light of a different wavelength. For example, it may be a cerium-activated yttrium aluminum garnet (YAG)-based phosphor, a cerium-activated lutetium aluminum garnet (LAG), an europium and/or chromium-activated nitrogen-containing calcium aluminosilicate ($CaO$—$Al_2O_3$—$SiO_2$)-based phosphor, an europium-activated silicate (($Sr,Ba$)$_2SiO_4$)-based phosphor, a β-sialon phosphor, a nitride-based phosphor such as a CASN-based or SCASN-based phosphor, a KSF-based phosphor ($K_2SiF_6$:Mn), a sulfide-based phosphor, etc. Moreover, phosphors, other than those described above, may be used that provides a similar performance, function and effect.

The wavelength conversion material may be a light-emitting substance such as those called "nanocrystal" and "quantum dot", for example. Such a material may be a semiconductor material including, for example, a group II-VI, group III-V or group IV-VI semiconductor, specifically, nano-sized highly-dispersed particles such as CdSe, core-shell-type $CdS_xSe_{1-x}$/ZnS and GaP.

Specifically, the light-diffusing material may be an oxide such as $SiO_2$, $Al_2O_3$, $Al(OH)_3$, $MgCO_3$, $TiO_2$, $ZrO_2$, ZnO, $Nb_2O_5$, MgO, $Mg(OH)_2$, SrO, $In_2O_3$, $TaO_2$, HfO, SeO, $Y_2O_3$, CaO, $Na_2O$ or $B_2O_3$, a nitride such as SiN, AlN or AlON, and a fluoride such as $MgF_2$. They may be used alone or as a mixture. In the cover member 51, a plurality of separately-formed layers each having a light-diffusing material dispersed in a resin as described above may be layered together.

The light-diffusing material may be an organic filler. For example, various resins having a particle shape may be used. Then, the various resins may include, for example, a silicone resin, a polycarbonate resin, a polyether sulfone resin, a polyarylate resin, a polytetrafluoroethylene resin, an epoxy resin, a cyanate resin, a phenolic resin, an acrylic resin, a polyimide resin, a polystyrene resin, a polypropylene resin, a polyvinyl acetal resin, a polymethyl methacrylate resin, a urethane resin, a polyester resin, etc. The light-diffusing material is preferably a material that does not substantially convert the wavelength of light emitted from the light-emitting element 31.

The content of the light-diffusing material can be appropriately determined within the range that light is diffused, and is, for example, in a range of about 0.01 wt % to about 30 wt %, and preferably in a range of about 2 wt % to about 20 wt %. The size of the light-diffusing material can also be appropriately determined within the range light is diffused, and is, for example, in a range of about 0.01 µm to about 30 µm, and preferably in a range of about 0.5 µm to about 10 µm. The shape may be a spherical shape or a scale shape, but is preferably a spherical shape so that light is diffused uniformly.

The shape of the cover member 51 influences the light distribution characteristics for light emitted from the light-emitting device 101. As will be described below, one may adjust the viscosity of the material of the cover member 51, or press a cast of an intended shape onto the formed cover member 51, thereby shaping the cover member 51.

[Method for Manufacturing Light-emitting Device 101]

The light-emitting device 101 can be manufactured by the following method, for example. First, the support 11, the power supply connector 21 and the light-emitting element 31 are provided. The support 11 includes the holes 11g therein.

The light-emitting element 31 and the power supply connector 21 are attached to the support 11. Various adhesives may be used for the attachment. A heat-resistant adhesive is preferably used for the attachment because heat is generated as the light-emitting element 31 emits light. The power supply connector 21 is located on the primary surface 11a of the support 11 so that the holes 22g of the power supply connector 21 correspond to the holes 11g of the support 11. The light-emitting element 31 is located, in a face-up position, on the primary surface 11a of the support 11 so that the substrate 32 side thereof is attached to the support 11 and so that the n electrode 37 and the p electrode 38 of the light-emitting element 31 are facing up.

Subsequently, the n electrode 37 and the p electrode 38 of the light-emitting element 31 and the two wire pads 23a are connected together by the wires 41. The wires 41 may be formed by utilizing a wire bonding technique using heat, pressure, ultrasonic waves, etc., used in the manufacture of semiconductor devices as described above.

Then, a cover member material having a wavelength conversion material, a light-diffusing material, or the like, dispersed in an uncured resin material, is prepared. The material is extruded so as to cover the light-emitting element 31, the wires 41 and the wire pads 23a, and the material is cured and molded by compression molding, injection molding, transfer molding, or the like. Alternatively, the viscosity of the material of the cover member 51 may be adjusted, and the material may be dripped or drawn in a pattern so as to cover the light-emitting element 31, the wires 41 and the wire pads 23a. Since a curved surface is formed by the surface tension of the material itself depending on the adjusted viscosity, it is possible to form the cover member 51 by curing the material by using a curing condition such as heat or ultraviolet light. With this method, the cover member 51 can be formed on the support 11 more easily with no need for a die. The viscosity adjustment of the material of the cover member in this formation method can be done based on the shape and the amount of addition of the light-diffusing material, the wavelength conversion material and the colorant, as well as the viscosity of the resin as described above. Thus, the light-emitting device 101 is completed.

In the light-emitting device 101, the wire pads 23a are provided on the power supply connector 21, and the power supply connector 21 and the light-emitting element 31 can be directly electrically connected to each other, without using a mounting board for mounting the light-emitting element 31 thereon. It possible to electrically connect the power supply connector 21 and the light-emitting element 31 to each other by placing the power supply connector 21 and the light-emitting element 31 on the support 11 and connecting the power supply connector 21 and the light-emitting element 31 by the wires 41. This makes it possible to reduce the number of parts and reduce the manufacturing cost. Moreover, with the provision of the power supply connector 21, it is possible to provide pins or connectors on the power-supplying circuit, which can then be electrically connected to the light-emitting device 101 easily and reliably. Therefore, it is possible to simplify the assembly of a lighting device, or the like, incorporating the light-emitting device 101, and it is possible to shorten the tact time and to reduce the failure rate in the manufacture.

The light-emitting element 31, the wires 41 and the wire pads 23a are covered by the cover member 51, thereby protecting the light-emitting element 31, and the wires between the light-emitting element 31 and the power supply connector. Therefore, it is possible to increase the reliability of the light-emitting device 101. Moreover, because a bare chip can be used as the light-emitting element 31, it is possible to further reduce the manufacturing cost as compared with cases where packaged light-emitting element is used.

Second Embodiment

Figure 2A:
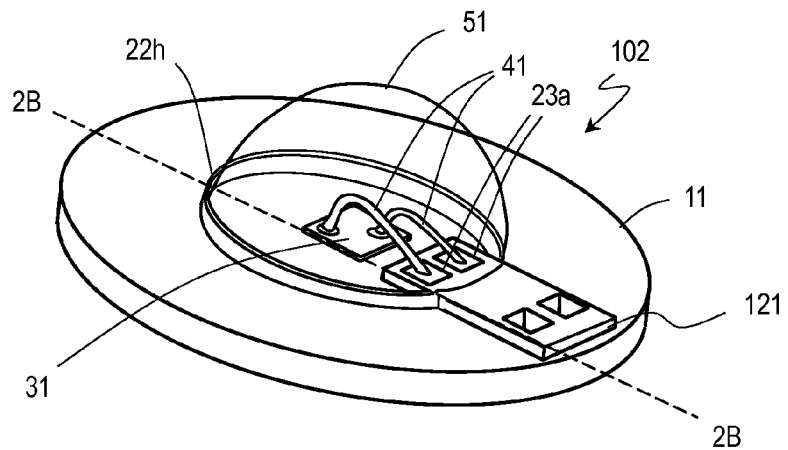
FIG. 2A is a perspective view showing an example of a light-emitting device of a second embodiment.
Figure 2B:
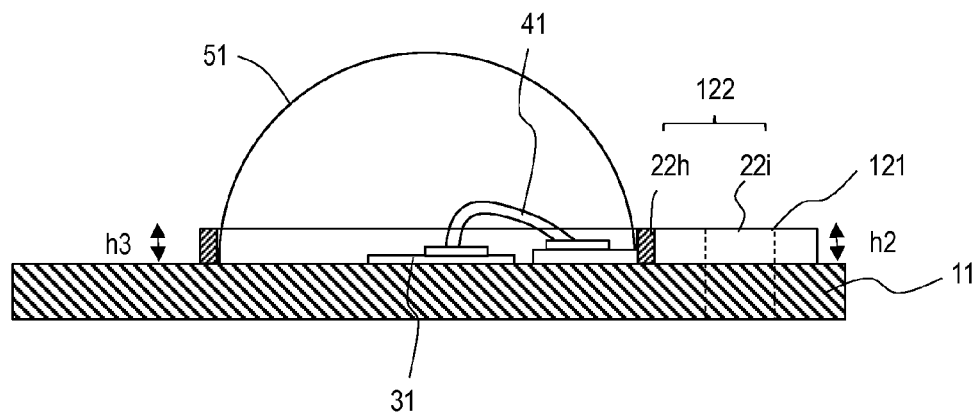
FIG. 2B is a cross-sectional view taken along line 2B-2B of FIG. 2A.
Figure 2C:
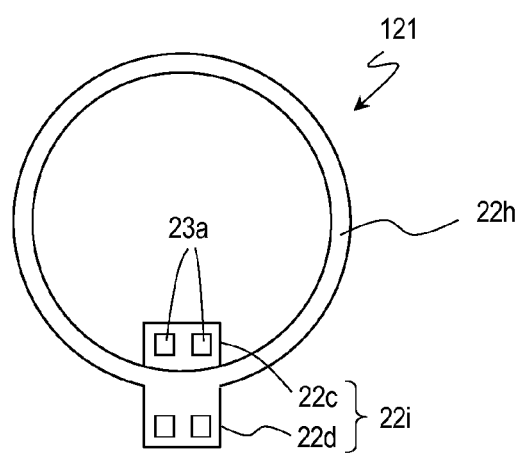
FIG. 2C is a top view of a power supply connector.

FIG. 2A and FIG. 2B are a perspective view and a cross-sectional view, respectively, showing an example of a light-emitting device 102 of the present embodiment. The light-emitting device 102 is different from the light-emitting device 101 of the first embodiment in that the light-emitting device 102 includes a power supply connector 121 whose shape is different from that of the power supply connector 21. FIG. 2C is a plan view showing the power supply connector 121.

The power supply connector 121 includes a body 122 located on the primary surface 11a of the support 11, and the body 122 includes a wall portion 22h and a base portion 22i.

As shown in FIG. 2C, the wall portion 22h has a ring shape defining a through hole therein. Therefore, when the power supply connector 121 is located on the primary surface 11a of the support 11, the wall portion 22h surrounds the light-emitting element 31 on the primary surface 11a. In the present embodiment, the space defined by the wall portion 22h has a circular shape, as seen from above (as seen from a direction vertical to the primary surface 11a), but the inside space defined by the wall portion 22h may be an elliptical shape other than a circular shape, or may be a polygonal shape such as a triangular shape or a quadrangular shape.

The base portion 22i includes the first portion 22c and the second portion 22d as described above in the first embodiment. The wall portion 22h is connected to the base portion 22i generally at the boundary between the first portion 22c and the second portion 22d. Thus, the first portion 22c is located inside the region surrounded by the wall portion 22h.

The height of the base portion 22i, particularly, the height h2 of the second portion 22d, is preferably equal to or lower than the height h3 of the wall portion 22h. By setting the height of the base portion 22i to be less than or equal to that of the wall portion 22h, the base portion 22i will not shade the light emitted from the light-emitting device 102, realizing uniform light distribution characteristics.

As shown in FIG. 2A and FIG. 2B, the cover member 51 is located inside the region surrounded by the wall portion 22h. The wall portion 22h defines the region where the cover member 51 is located. Particularly, when the uncured material of the cover member 51 is dripped or drawn in a pattern so as to cover the light-emitting element 31, the wires 41 and the wire pads 23a, as described above in the first embodiment, the wall portion 22h prevents the material from excessively spreading on the primary surface 11a of the support 11 and limits the movement of the material so that the material remains inside an intended region. Therefore, when the material is cured to form the cover member 51, the shape and the size of the bottom surface of the cover member 51 in contact with the support 11 can be controlled by the wall portion 22h. More specifically, it is possible to control the surface shape and the size of the cover member 51 by adjusting the amount of the material, the viscosity thereof, and the size and the shape defined by the wall portion 22h.

Thus, with the light-emitting device 102, it is easier to form the cover member 51 having an intended shape even when the material of the cover member 51 is dripped or drawn in a pattern and the outer shape of the cover member 51 is controlled by the surface tension thereof. That is, it is possible to realize the cover member 51 having a good formability even with a simple process.

Third Embodiment

Figure 3A:
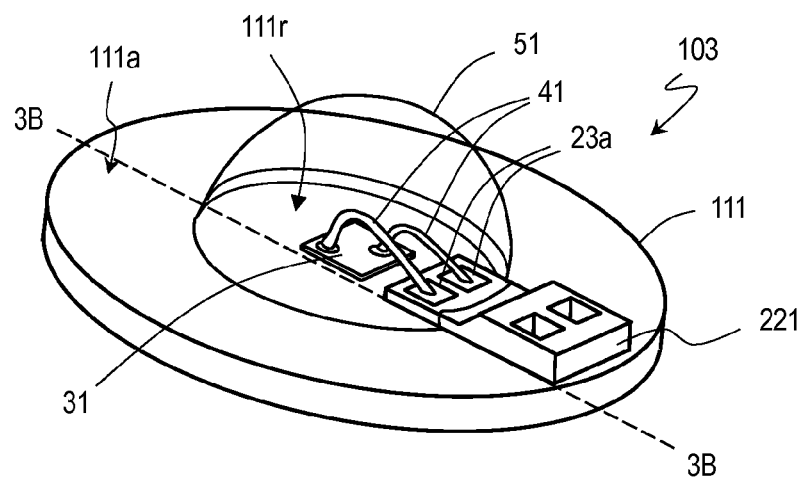
FIG. 3A is a perspective view showing an example of a light-emitting device of a third embodiment.
Figure 3B:
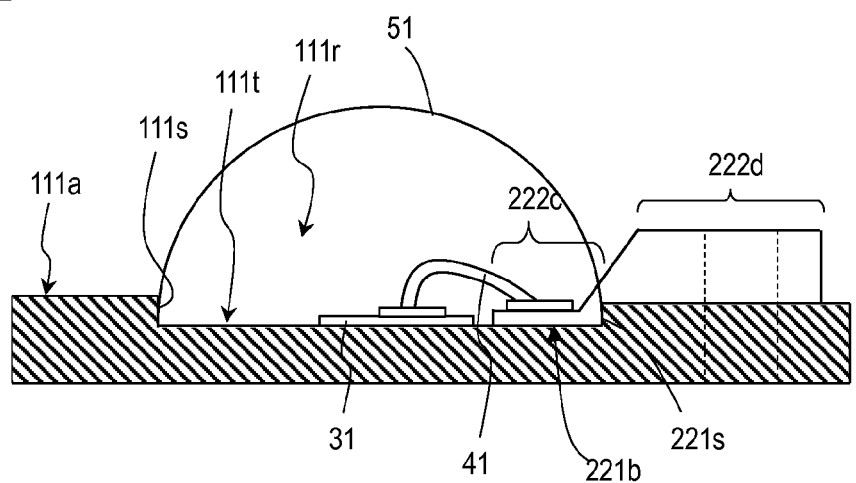
FIG. 3B is a cross-sectional view taken along line 3B-3B of FIG. 3A.

FIG. 3A and FIG. 3B are a perspective view and a cross-sectional view, respectively, showing an example of a light-emitting device 103 of the present embodiment. In the light-emitting device 102 of the second embodiment, the wall portion 22h defining the region where the cover member 51 is located is included in the power supply connector 121. In contrast, with the light-emitting device 103 of the present embodiment, a support 111 has a depressed portion 111r, and the depressed portion 111r defines the region where the cover member 51 is located.

As shown in FIG. 3A and FIG. 3B, the depressed portion 111r is provided on a primary surface 111a of the support 111. As the support 111 is seen from above, the depressed portion 111r has a circular shape. The depressed portion 111r has a side surface 111s and a bottom surface 111t, and the bottom surface 111t is the region where the cover member 51 is located.

A power supply connector 221 has a lower surface 221b, which has a step 221s. The step 221s has a height corresponding to the side surface 111s of the depressed portion 111r, and the power supply connector 221 is divided into a first portion 222c and a second portion 222d by the step 221s. The first portion 222c is in contact with the bottom surface 111t of the depressed portion 111r, and the second portion 222d is located on the primary surface 111a around the depressed portion 111r. That is, the first portion 222c is located inside the depressed portion 111r.

When the support 111 is formed from a metal plate, for example, the support 111 having the depressed portion 111r can be formed by pressing the primary surface 111a of the support 111 by a press-working process, or the like, to compress a portion of the support 111. When the support 111 is formed from a ceramic, a ceramic plate is provided, and a region thereof corresponding to the depressed portion 111r may be ground off, or green sheets with a hole therein corresponding to the depressed portion 111r may be layer and sintered together.

As in the second embodiment, the cover member 51 is located inside the depressed portion 111r, and the depressed portion 111r defines the region where the cover member 51 is located. When the uncured material of the cover member 51 is dripped or drawn in a pattern so as to cover the light-emitting element 31, the wires 41 and the wire pads 23a, the material is kept inside the depressed portion 111r. Therefore, when the material is cured to form the cover member 51, it is possible to control the shape and the size of the bottom surface of the cover member 51, which is the region to be in contact with the support 11. As in the second embodiment, it is possible to control the surface shape and the size of the cover member 51 by adjusting the amount of the material, the viscosity thereof, and the size and the shape of the bottom surface 111t of the depressed portion 111r.

Thus, with the light-emitting device 103, as in the second embodiment, it is easier to form the cover member 51 having an intended shape even when the material of the cover member 51 is dripped or drawn in a pattern and the outer shape of the cover member 51 is controlled by the surface tension thereof. That is, it is possible to realize the cover member 51 having a good formability even with a simple process.

Figure 4A:
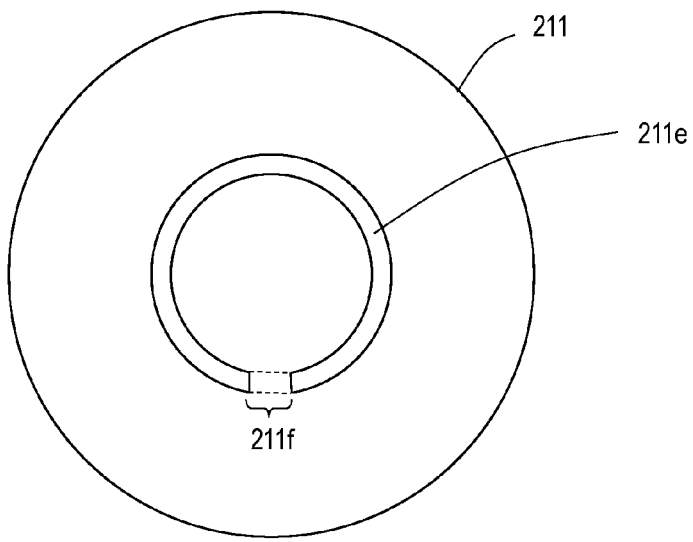
FIG. 4A is a top view showing another example of a support used in a light-emitting device of the third.
Figure 4B:
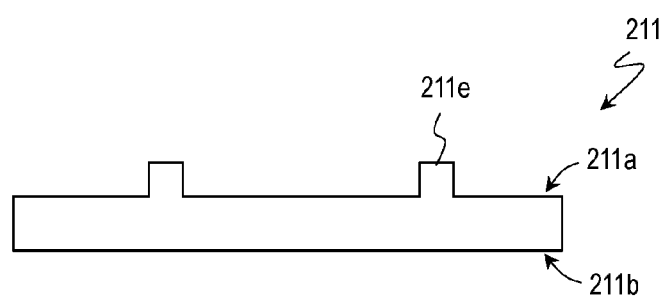
FIG. 4B and FIG. 4C each show a cross-sectional shape thereof.

The configuration provided in the support 11 for defining the region where the cover member 51 is located can be a depressed portion and can be other configurations as well. For example, it may be a ridge portion protruding from the primary surface of the support. FIG. 4A and FIG. 4B are a top view and a cross-sectional view, respectively, showing a support 211 having a ridge portion 211e. The ridge portion 211e of the support 211 has a ring shape and protrudes from a primary surface 211a. As shown in FIG. 4A, the ridge portion 211e is absent in a region 211f, thereby breaking the ring in the region 211f. For example, the power supply connector 21 of the first embodiment can be located in the region 211f. This closes the region inside the ridge portion 211e, and an uncured material of the cover member 51, located inside the ridge portion 211e, is prevented from flowing out of the ridge portion 211e. Moreover, the provision of the region 211f allows the power supply connector 21 to be located on the primary surface 211a of the support 211 even when the lower surface 22b of the power supply connector 21 is flat.

Figure 4C:
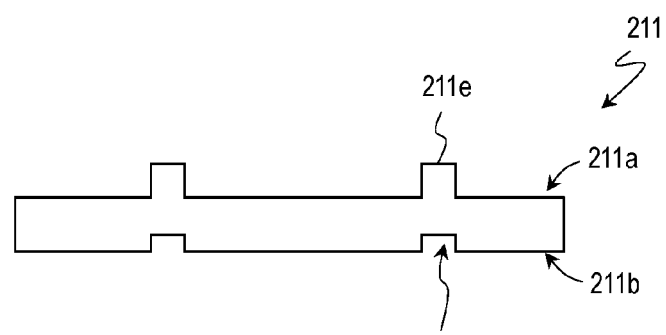

A back surface 211b of the support 211 having the ridge portion 211e may be flat as shown in FIG. 4B, or may have a ring-shaped depressed portion 211g located so as to correspond to the ridge portion 211e of the primary surface 211a as shown in FIG. 4C. The support 211 having such a shape as shown in FIG. 4B can be formed by, for example, providing a flat metal plate, and removing a region thereof excluding the ridge portion 211e by grinding, etc. The support 211 having a shape as shown in FIG. 4C may be formed by providing a pair of dies having a protruding portion and a depressed portion corresponding to the ridge portion 211e, and pressing a metal plate by the pair of dies disposing the metal plate therebetween using a press working process.

Figure 4D:
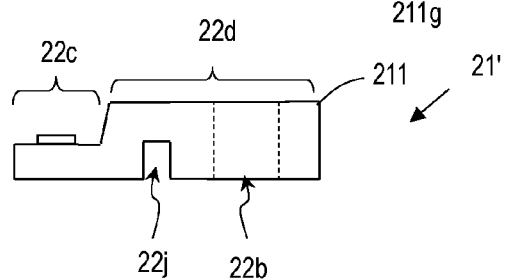
FIG. 4D is a lateral side view showing an example of a power supply connector.

With the support 211 shown in FIG. 4A, the ridge portion 211e is absent in the region where the power supply connector is located. However, the support may have a ring-shaped ridge portion 211e with no region 211f where the ring is broken. In this case, a power supply connector 21' may be provided with the lower surface 22b having a groove 22j for straddling the ridge portion 211e, as shown in FIG. 4D, and the power supply connector 21' may be located on the primary surface of the support so that the groove 22j engages with the ridge portion 211e. The groove 22j is preferably located in the vicinity of the boundary between the first portion 22c and the second portion 22d. Then, when a light-emitting device is produced by using the power supply connector 21', the first portion 22c can be located inside the region surrounded by the ring-shaped ridge portion 211e.

Fourth Embodiment

Figure 5:
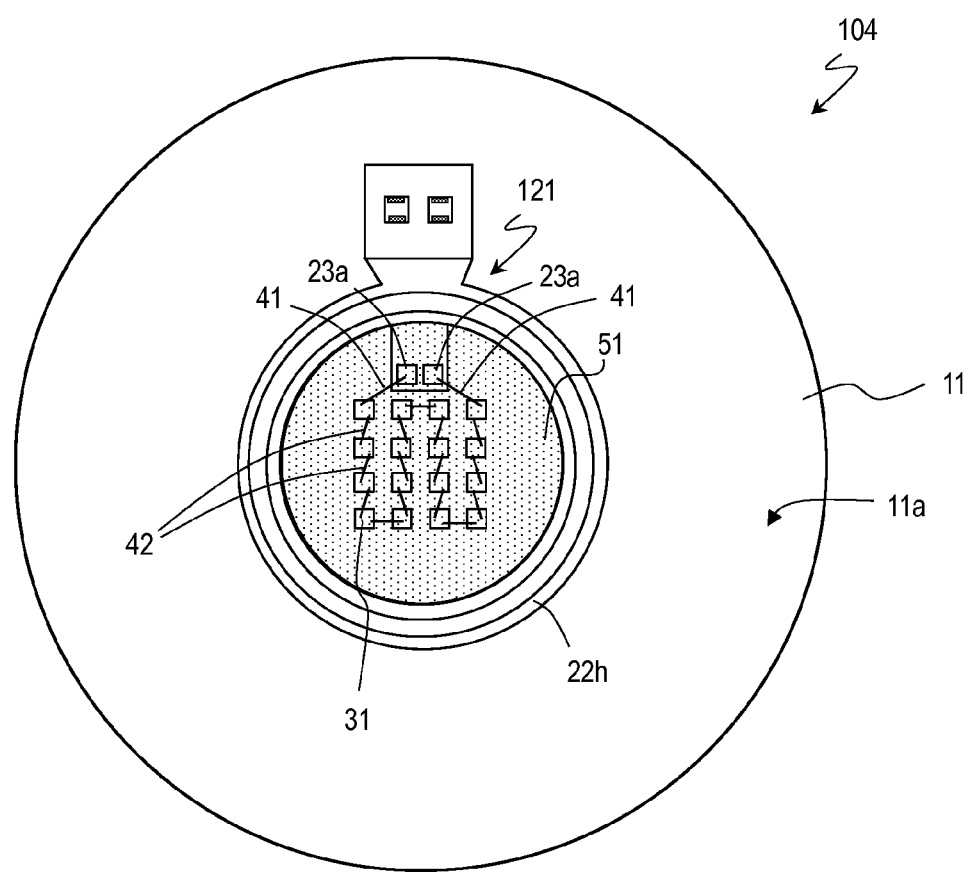
FIG. 5 is a top view showing an example of a light-emitting device of a fourth embodiment.

FIG. 5 is a top view showing an example of a light-emitting device 104 of the present embodiment. The light-emitting device 104 of the fourth embodiment is different from the light-emitting device 102 of the second embodiment in that it includes a plurality of light-emitting elements 31. As shown in FIG. 5, the light-emitting device 104 includes a plurality of light-emitting elements 31 located inside the region surrounded by the wall portion 22h on the primary surface 11a of the support 11. While FIG. 5 shows sixteen light-emitting elements 31, the number of light-emitting elements 31 is not limited thereto, and it may be any number of two or more. Each of the light-emitting elements 31 is electrically connected to the two wire pads 23a. FIG. 5 shows an example in which sixteen light-emitting elements 31 are connected together in series by wires 42, and those light-emitting elements 31 at the opposite ends are connected to the wire pads 23a by the wires 41. However, as well as the series connection, the light-emitting elements 31 may all be connected together in a parallel connection, or groups of a predetermined number of serially-connected elements may be connected together in a parallel connection.

Even when the light-emitting device 104 includes a plurality of light-emitting elements 31, all of the light-emitting elements 31 are located in the region surrounded by the wall portion 22h of the power supply connector 121. The wall portion 22h defines the region where the cover member 51 is located, and the cover member 51 is located inside the region surrounded by the wall portion 22h. Therefore, the cover member 51 inside the wall portion 22h covers all of the light-emitting elements 31. The cover member 51 is shaded in FIG. 5 for ease of understanding. Also in the subsequent figures, the cover member 51 shown in a top view is shaded.

In the light-emitting device 104, the wires 42 connecting between the light-emitting elements 31, the wires 41 connecting between the light-emitting elements 31 and the wire pads 23a, and the wire pads 23a are covered by the cover member 51, thereby protecting the light-emitting elements 31 and the wires connecting between the light-emitting elements 31 and the power supply connector. Therefore, it is possible to realize the light-emitting device 104 having a high luminance and a high reliability.

Fifth Embodiment

Figure 6:
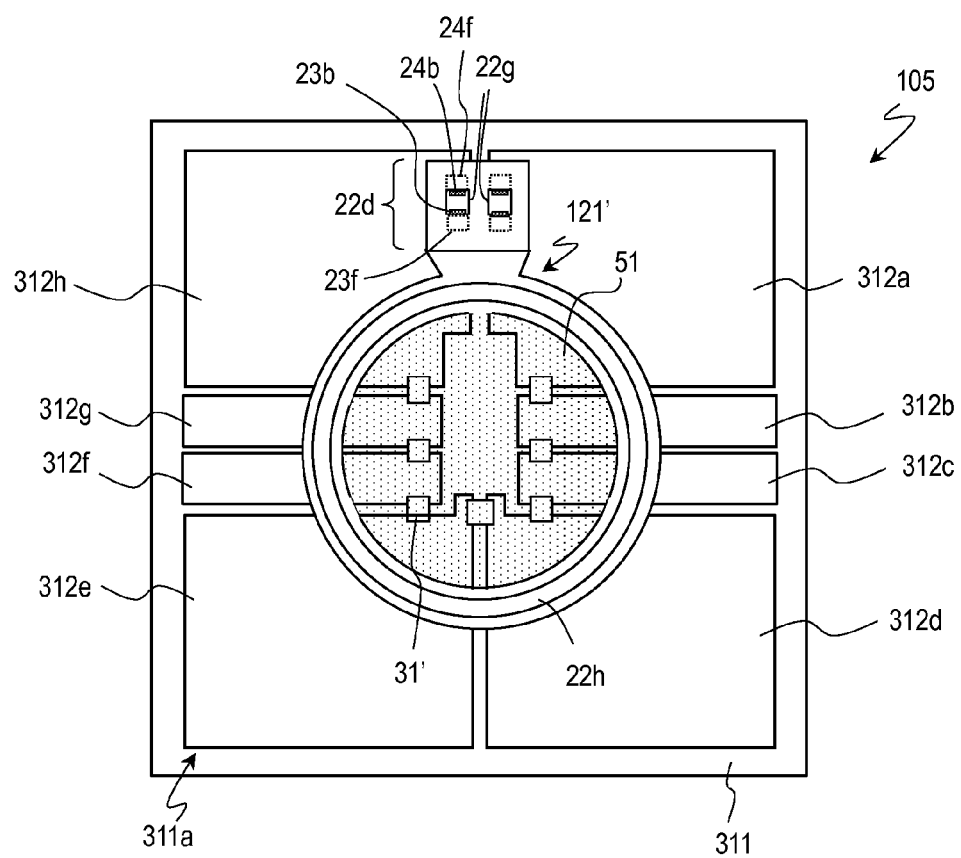
FIG. 6 is a top view showing an example of a light-emitting device of a fifth embodiment.

FIG. 6 is a top view showing an example of a light-emitting device 105 of the present embodiment. The light-emitting devices of the preceding embodiments each include a power supply connector having wire pads on the upper surface. In contrast, the light-emitting device 105 of the present embodiment includes a power supply connector including electrodes that can be surface-mounted.

Specifically, the light-emitting device 105 includes a support 311, a power supply connector 121', a plurality of light-emitting elements 31', and the cover member 51. The support 311 has conductive patterns 312a to 312h on a primary surface 311a.

As in the second embodiment, the power supply connector 121' includes the wall portion 22h, and two holes 22g located in the second portion 22d of the base portion. The external terminals 23b and 24b are located in each hole 22g. The power supply connector 121' includes electrodes 23f and 24f provided on the lower surface, and the electrodes 23f and 24f are electrically connected to the external terminals 23b and 24b, respectively, located in the hole 22g. The electrodes 23f and 24f connected to the external terminals 23b and 24b of one hole 22g are electrically connected to a conductive pattern 312a. The electrodes 23f and 24f connected to the external terminals 23b and 24b of the other hole 22g are electrically connected to a conductive pattern 312h.

Each of the light-emitting element 31' includes a pair of electrodes that can be surface-mounted or flip chip bonded, and two of the conductive patterns 312a to 312h are electrically connected to the pair of electrodes. Each of the light-emitting elements 31' may be a resin-encapsulated light-emitting element or may be a bare chip.

The electrodes 23f and 24f located on the lower surface of the power supply connector 121' and the electrodes of the light-emitting elements 31' are electrically connected to the conductive patterns 312a to 312h by using flip chip bonding, conductive adhesive, solder reflow, etc.

As in the second embodiment, the wall portion 22h has a ring shape, surrounding the light-emitting elements 31' on the primary surface 311a of the support 311. The cover member 51 is located inside the region surrounded by the wall portion 22h on the primary surface 311a of the support 311.

The light-emitting device 105 includes the electrodes 23f and 24f provided on the lower surface of the power supply connector 121', and the power supply connector 121' can be surface-mounted. Therefore, with the provision of conductive patterns on the surface of the support 311, it is possible to electrically connect the light-emitting elements 31' to the electrodes 23f and 24f of the power supply connector. Moreover, the power supply connector 121' includes the wall portion 22h, and the cover member 51 is located inside the region surrounded by the wall portion 22h. Thus, the wall portion 22h defines the region where the cover member 51 is located, as described above in the second embodiment. Specifically, when the uncured material of the cover member 51 is dripped or drawn in a pattern so as to cover the light-emitting elements 31', the wall portion 22h prevents the material from excessively spreading on the primary surface 311a of the support 311 and limits the movement of the material so that the material remains inside an intended region. Therefore, when the material is cured to form the cover member 51, the shape and the size of the bottom surface of the cover member 51 in contact with the support 311 can be controlled by the wall portion 22h. More specifically, it is possible to control the surface shape and the size of the cover member 51 by adjusting the amount of the material, the viscosity thereof, and the size and the shape defined by the wall portion 22h.

Thus, with the light-emitting device 105, it is easier to form the cover member 51 having an intended shape even when the material of the cover member 51 is dripped or drawn in a pattern and the outer shape of the cover member 51 is controlled by the surface tension thereof. That is, it is possible to realize the cover member 51 having good formability even with a simple process.

Figure 7:
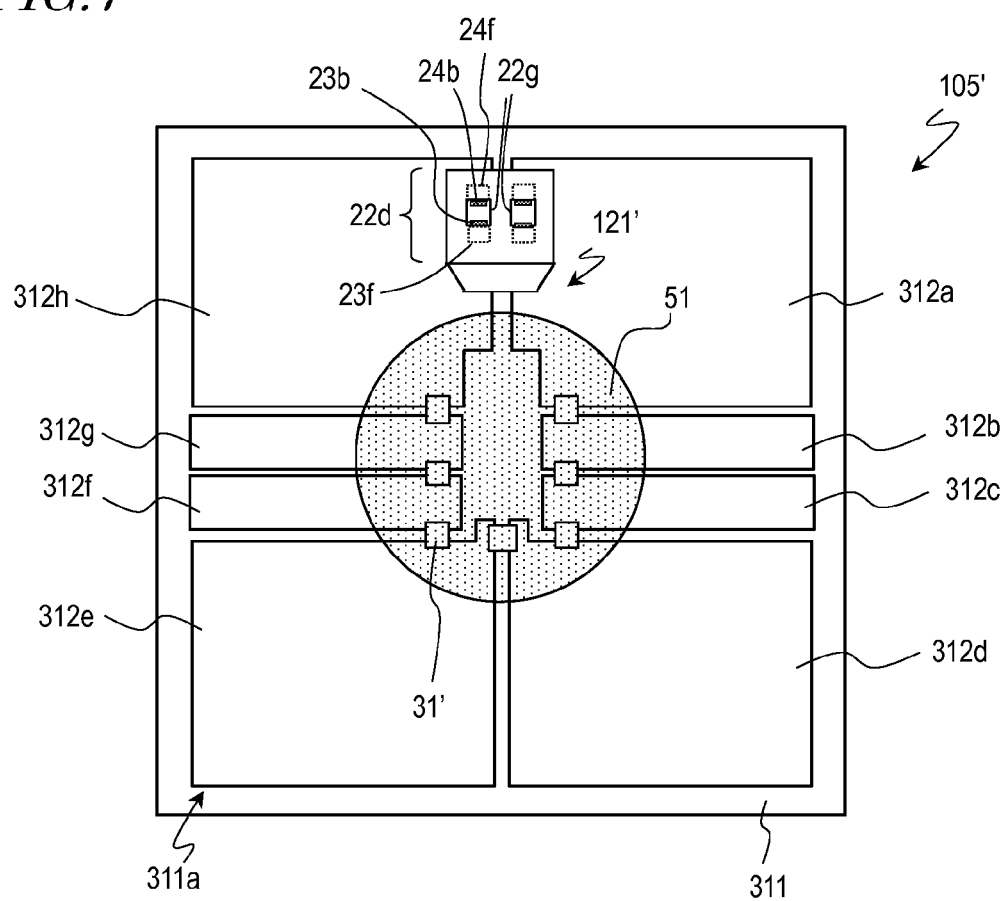
FIG. 7 is a top view showing another example of a light-emitting device of the fifth embodiment.

The power supply connector 121' includes the wall portion 22h in the present embodiment. However, the power supply connector 121' may include no wall portion 22h if the cover member 51 is molded by using a mold, or the like, or if it is not needed to mold the cover member 51. In a light-emitting device 105' shown in FIG. 7, the power supply connector 121' does not include the wall portion 22h. The cover member 51 is provided on the support 311, while covering the light-emitting elements 31'.

In the light-emitting device 105', the power supply connector 121' and light-emitting elements are electrically connected together via conductive patterns provided on the support 311, thereby eliminating the need to separately provide a mounting board. Since the light-emitting elements 31' are covered by the cover member 51, it is possible to increase the reliability of the light-emitting device.

Figure 8:
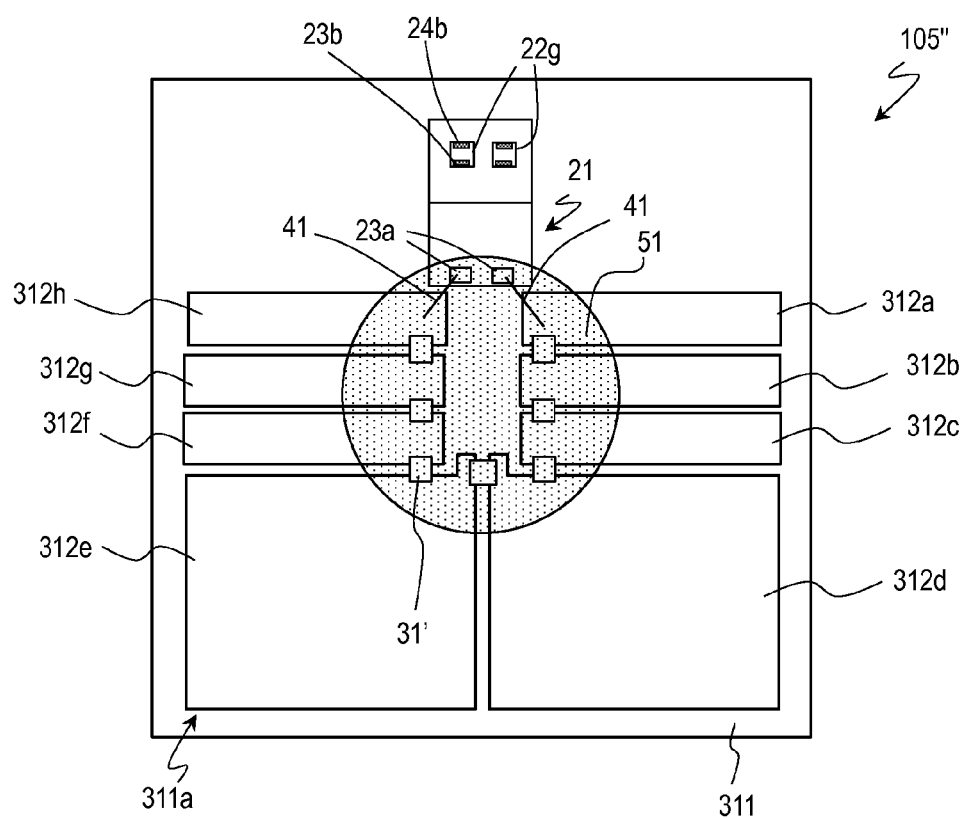
FIG. 8 is a top view showing another example of a light-emitting device of the fifth embodiment.

While the light-emitting elements are surface-mounted, the power supply connector may be electrically connected to the light-emitting elements via wires. As shown in FIG. 8, a light-emitting device 105" is different from the light-emitting device 105' in that the power supply connector 21 does not include electrodes that can be surface-mounted but includes the wire pads 23a as in the first embodiment. The power supply connector 21 includes the wire pads 23a electrically connected to the external terminal 23b as in the first embodiment, and is located on the primary surface 311a of the support 311 using an adhesive, or the like. A set of wire pads 23a are electrically connected to the conductive patterns 312a and 312h via the wires 41. The cover member 51 is provided on the primary surface 311a of the support 311, while covering the plurality of light-emitting elements 31', the wire pads 23a and the wires 41.

In the light-emitting device 105", the plurality of light-emitting elements 31' are electrically connected via the conductive patterns provided on the support 311, thereby eliminating the need to connect them via wires or to separately provide a mounting board. Since the light-emitting elements 31' are covered by the cover member 51, it is possible to increase the reliability of the light-emitting device.

Sixth Embodiment

Figure 9A:
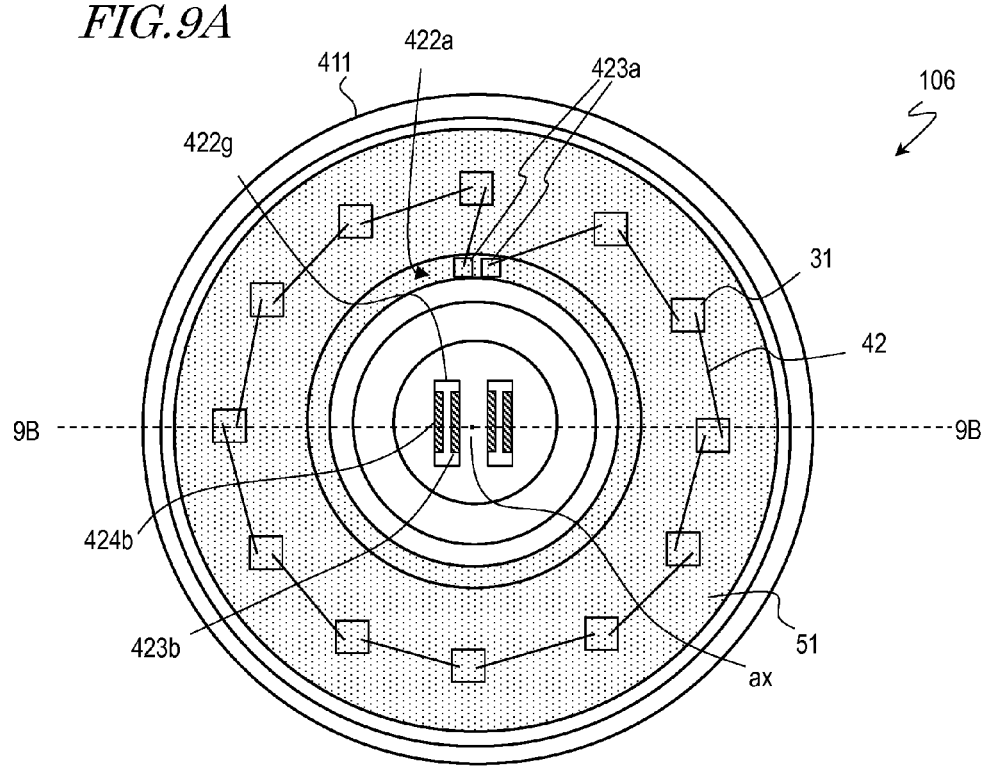
FIG. 9A and FIG. 9B are a top view and a cross-sectional view, respectively, showing an example of a light-emitting device of a sixth embodiment.
Figure 9B:
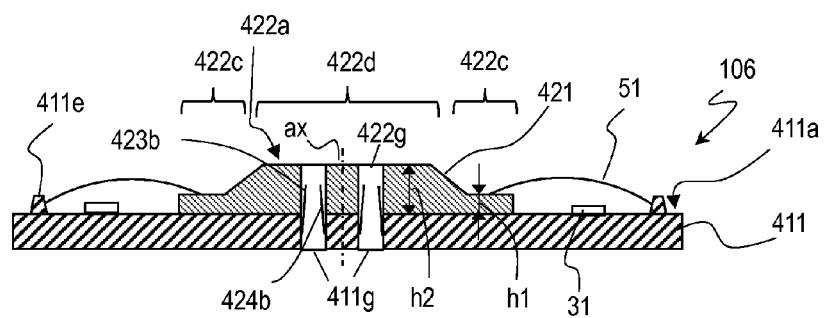

FIG. 9A and FIG. 9B are a top view and a cross-sectional view, respectively, showing a light-emitting device 106 of the present embodiment. The light-emitting device 106 includes a support 411, a power supply connector 421, the light-emitting elements 31 and the cover member 51. The support 411 has a disc shape, and includes a ridge portion 411e protruding from a primary surface 411a thereof. The ridge portion 411e has a ring shape, and uninterruptedly surrounds the light-emitting elements 31 located on the primary surface 411a. A set of holes 411g are provided in the vicinity of the center of the support 411.

The power supply connector 421 is located at the center of the primary surface 411a of the support 411. The power supply connector 421 has a circular shape as seen from above, and includes a second portion 422d located at the center, and a ring-shaped first portion 422c surrounding the second portion 422d. A set of holes 422g are provided in the vicinity of the center of the second portion 422d, and the holes 422g are aligned with the holes 411g of the support 411. External terminals 423b and 424b are located in each of the holes 422g. As in the first embodiment, the height h2 of the second portion 422d is greater than the height h1 of the first portion 422c.

A set of wire pads 423a are located on an upper surface 422a of the first portion 422c of the power supply connector 421. The wire pads 423a are electrically connected to the external terminal 423b via a connecting portion, as described above in the first embodiment.

The light-emitting elements 31 are located on the primary surface 411a between the power supply connector 421 and the ridge portion 411e, within the region surrounded by the ridge portion 411e. In the present embodiment, twelve light-emitting elements 31 are arranged in a circular pattern with approximately equal intervals. Electrodes of the twelve light-emitting elements 31 are connected in series by the wires 42. Those of the serially-connected twelve light-emitting elements 31 at the opposite ends are connected to the pair of wire pads 423a via the wires 41.

The cover member 51 is located between the ridge portion 411e and the power supply connector 421. More specifically, the cover member 51 is located, in a ring pattern, inside the region surrounded by the ridge portion 411e on the primary surface 411a so that the inner edge of the ring pattern is located on the first portion 422c of the power supply connector 421. As shown in FIG. 9A, the cover member 51 covers the light-emitting elements 31, the wires 41, the wires 42 and the wire pads 423a.

In the light-emitting device 106, the ridge portion 411e has a ring shape, thereby closing the region inside the ridge portion 411e. An uncured material of the cover member 51 located inside the ridge portion 411e is prevented from flowing over and remains inside the predetermined region, thus forming the cover member 51.

Moreover, the power supply connector 421 is located at the center of the primary surface 411a, and a plurality of light-emitting elements 31 are located along a circular pattern outside the power supply connector 421. Therefore, light from the plurality of light-emitting elements 31 overlap with each other above the power supply connector 421 so that the emitted light is unlikely shaded by the power supply connector 421. Particularly, although the second portion 422d has a large height in order to ensure stable connection with the pins to be inserted from outside, the second portion 422d is located closer to the center of the primary surface 411a than the first portion 422c (i.e., the taller portion is located further away from the light-emitting elements 31 than the shorter portion), making it unlikely that the emitted light is shaded.

Moreover, since the shape and the arrangement of the power supply connector 421 are in rotational symmetry with respect to the axis ax vertical to the center of the primary surface 411a, the intensity and the distribution of the light emitted from the light-emitting device 106 are approximately equal at any azimuthal angle about the axis ax. Therefore, it is possible to provide a lighting device having uniform light distribution characteristics.

Other Embodiments and Variations

In the embodiments described above, the power supply connector includes two holes each having an opening on the upper surface and on the lower surface, with external terminals located inside each hole. A power supply connector of this configuration engages with pin-shaped terminals and is capable of easily and reliably establishing electrical connection with other circuits, etc. The light-emitting device of the present disclosure may employ different structures and different configurations from those power supply connectors disclosed in the embodiments described above.

Figure 10A:
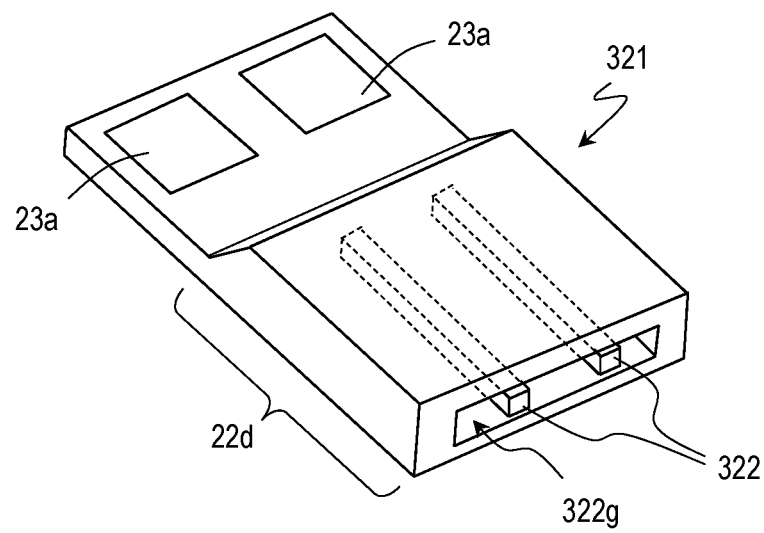
FIG. 10A and FIG. 10B are perspective views each showing an example of a power supply connector.

For example, a power supply connector 321 shown in FIG. 10A includes a depressed portion 322g having an opening on the side surface, and includes a set of pins 322 inside the depressed portion 322g for external connection. The power supply connector 321 can engage with a connector that has a protruding portion to be inserted into the depressed portion 322g, and that includes holes corresponding to the pins 322 and terminals provided inside the holes. Thus, the end portion of another connector to be attached to the power supply connector 321 may be of a type that is inserted from the side surface.

Figure 10B:
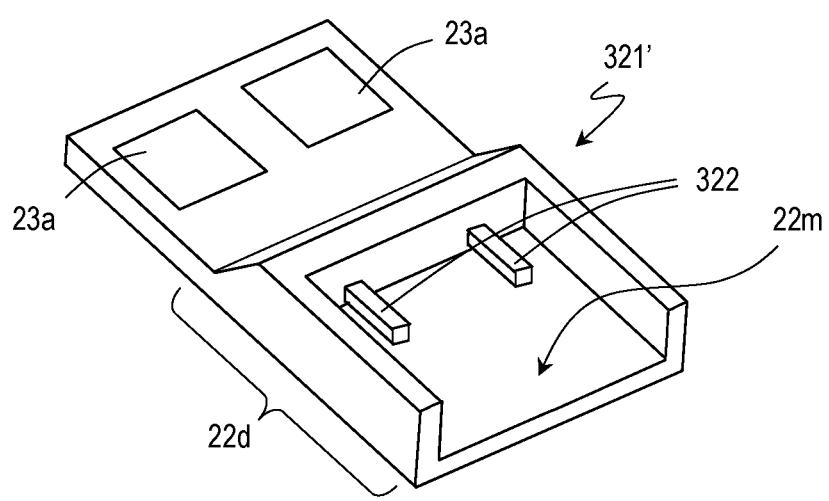

A power supply connector 321' shown in FIG. 10B includes a depressed portion 22m having an opening on the side surface and on the upper surface, and includes a set of pins 322, inside the depressed portion 22m, extending toward the opening on the side surface. Another connector to engage with the power supply connector 321' may have a protruding portion to engage with the depressed portion 22m, and may have grooves at positions of the protruding portion corresponding to the pins 322 with terminals provided inside the grooves. With this configuration, the protruding portion can be engaged inside the depressed portion 22m by pressing the connector from above onto the power supply connector 321'. Particularly, with this configuration, it is easy to insert a connector, realizing a high workability.

Any structural feature described above in any of the first to sixth embodiments may be combined with a light-emitting device of any other embodiment.

The light-emitting device according to an embodiment of the present disclosure can be used in various applications such as lighting devices, displays and LCD backlights.

While the present invention has been described with respect to exemplary embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A light-emitting device comprising:
   a support having a primary surface;
   a power supply connector located on the primary surface of the support and comprising a body, at least one hole located in the body, at least one wire pad located on a surface of the body, at least one external terminal located inside the at least one hole, and at least one conductive connecting portion electrically connected to the at least one wire pad;
   a light-emitting element located on the primary surface of the support;
   at least one wire connecting the light-emitting element and the at least one wire pad; and
   a cover member located on the primary surface of the support and covering the light-emitting element and the at least one wire pad.

2. The light-emitting device according to claim 1,
   wherein a first portion of the power supply connector, at which the at least one wire pad is located, is covered by the cover member; and
   wherein a second portion of the power supply connector is exposed from the cover member.

3. The light-emitting device according to claim 2,
   wherein the body comprises:
   a base portion, and
   a wall portion having a ring shape that surrounds the light-emitting element;
   wherein the at least one hole and the at least one external terminal are located at the base portion; and
   wherein the cover member is located inside the wall portion.

4. The light-emitting device according to claim 3,
   wherein the base portion includes a first portion located inside the wall portion and a second portion located outside the wall portion; and
   wherein the at least one wire pad is located on the first portion and the at least one external terminal is located on the second portion.

5. The light-emitting device according to claim 4,
   wherein a height of the base portion is equal to or lower than a height of the wall portion.

6. The light-emitting device according to claim 2,
   wherein the support includes a depressed portion located on the primary surface;
   wherein the light-emitting element is located inside the depressed portion; and
   wherein the cover member is located inside the depressed portion.

7. The light-emitting device according to claim 1,
   wherein the support includes a ring-shaped ridge portion protruding from the primary surface and surrounding the light-emitting element; and
   wherein the cover member is located inside the ridge portion.

8. The light-emitting device according to claim 6,
   wherein the power supply connector is located inside a region surrounded by the ridge portion on the primary surface; and
   wherein the cover member is located between the ridge portion and the power supply connector.

9. The light-emitting device according to claim 1,
   wherein the support comprises at least one hole that corresponds to the at least one hole located in the body of the power supply connector.

10. The light-emitting device according to claim 1,
    wherein the at least one hole extends entirely through the body from an uppermost surface of the body to a lowermost surface of the body.

* * * * *